(12) United States Patent
Kapusta et al.

(10) Patent No.: US 10,804,174 B2
(45) Date of Patent: *Oct. 13, 2020

(54) NON-MAGNETIC PACKAGE AND METHOD OF MANUFACTURE

(71) Applicant: General Electric Company, Schenectady, NY (US)

(72) Inventors: Christopher James Kapusta, Delanson, NY (US); Marco Francesco Aimi, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/205,451

(22) Filed: Nov. 30, 2018

(65) Prior Publication Data

US 2019/0103331 A1 Apr. 4, 2019

Related U.S. Application Data (63) Continuation of application No. 14/529,311, filed on Oct. 31, 2014, now Pat. No. 10,431,509.

(51) Int. Cl.
| | |
|---|---|
| *H01L 23/552* | (2006.01) |
| *H01L 23/10* | (2006.01) |
| *B81B 7/00* | (2006.01) |

(52) U.S. Cl.
CPC ............ *H01L 23/10* (2013.01); *B81B 7/0077* (2013.01); *H01L 2224/48091* (2013.01); *H01L 2224/49171* (2013.01); *H01L 2924/0002* (2013.01)

(58) Field of Classification Search
None
See application file for complete search history.

(56) References Cited

U.S. PATENT DOCUMENTS

| | | |
|---|---|---|
| 4,506,108 A | 3/1985 | Kersch et al. |
| 4,582,240 A | 4/1986 | Lux et al. |
| 4,659,006 A | 4/1987 | Polansky |
| 4,866,505 A | 9/1989 | Roberts et al. |
| 5,178,745 A | 1/1993 | Abys et al. |
| 5,200,640 A | 4/1993 | Scheftic et al. |
| 5,779,081 A | 7/1998 | Kimura et al. |
| 6,390,353 B1 | 5/2002 | Lichtenberger |
| 6,848,610 B2 | 2/2005 | Liu |

(Continued)

FOREIGN PATENT DOCUMENTS

| | | |
|---|---|---|
| CN | 201450001 U | 5/2010 |
| GB | 1431919 A | 4/1976 |
| JP | 2003324228 A | 11/2003 |

OTHER PUBLICATIONS

Silicon Sensing Limited, Gemini Dual-Axis Accelerometer CAS200 Technical Datasheet, CAS200-00-0100-132 Rev 5, 2013, pp. 1-26.

(Continued)

*Primary Examiner* — Daniel Whalen
(74) *Attorney, Agent, or Firm* — Ziolkowski Patent Solutions Group, SC; Jean K Testa (57) ABSTRACT

A non-magnetic hermetic package includes walls that surround an open cavity, with a generally planar non-magnetic and metallic seal ring disposed in a continuous loop around upper edges of the walls; a sensitive component that is bonded within the cavity; and a non-magnetic lid that is sealed to the seal ring to close the cavity by a metallic seal.

17 Claims, 4 Drawing Sheets

(56) References Cited

U.S. PATENT DOCUMENTS

| | | |
|---|---|---|
| 7,253,029 B2 | 8/2007 | Geisler et al. |
| 7,743,963 B1 | 6/2010 | Chung |
| 7,755,292 B1 | 7/2010 | Tuma et al. |
| 8,536,663 B1 | 9/2013 | Kuo et al. |
| 10,208,382 B2 * | 2/2019 | Kapusta .............. B81C 1/00269 |
| 10,431,509 B2 * | 10/2019 | Kapusta ................ B81B 7/0077 |
| 2003/0075939 A1 | 4/2003 | Bendat et al. |
| 2003/0104651 A1 | 6/2003 | Kim et al. |
| 2003/0160398 A1 | 8/2003 | Moidu |
| 2003/0230798 A1 | 12/2003 | Lin et al. |
| 2004/0188496 A1 | 9/2004 | Liu |
| 2005/0012188 A1 | 1/2005 | Val |
| 2005/0218506 A1 | 10/2005 | Geisler et al. |
| 2007/0063336 A1 * | 3/2007 | Hase ..................... H01L 23/481 257/698 |
| 2007/0222008 A1 | 9/2007 | Chen et al. |
| 2008/0271908 A1 | 11/2008 | Yamamoto et al. |
| 2009/0309203 A1 | 12/2009 | Seppala et al. |
| 2011/0013869 A1 | 1/2011 | Pezeshki et al. |
| 2011/0048757 A1 | 3/2011 | Yamamoto et al. |
| 2012/0155055 A1 * | 6/2012 | Kang .................... H01L 23/562 361/820 |
| 2012/0176135 A1 | 7/2012 | Iannotti et al. |
| 2012/0177853 A1 * | 7/2012 | Gruenwald .......... H03H 9/1071 428/34.4 |
| 2014/0126167 A1 | 5/2014 | Bozorgi et al. |
| 2015/0340298 A1 | 11/2015 | Kothandapani |

OTHER PUBLICATIONS

Weidong et al., "FEA Modeling of a Wafer Level Seam Sealing Approach for MEMS Packaging," 2004, pp. 1-13.

Zhou et al., "Au/Sn Solder Alloy and Its Applications in Electronics Packaging," Coining, Inc., Institute of Microelectronics, Beijing, China, 1999, pp. 1-7.

Nonmagnetic Materion Combo Lids, Need for Nonmagnetic Properties in Lids, Materion website, Newsletter, Jun. 2013, pp. 1-2.

International Search Report for International Application No. PCT/US2015/057534, dated Feb. 2, 2016, 3 pages.

International Search Report for International Application No. PCT/US2015/057534, dated Feb. 17, 2016, 3 pages.

* cited by examiner

NON-MAGNETIC PACKAGE AND METHOD OF MANUFACTURE

CROSS-REFERENCE TO RELATED APPLICATION

The present application is a continuation of, and claims priority to, U.S. patent application Ser. No. 14/529,311, filed Oct. 31, 2014, the disclosure of which is incorporated herein by reference in its entirety.

BACKGROUND

Technical Field

Embodiments of the invention relate generally to packaging of devices that are sensitive to temperature, humidity, and/or atmospheric constituents. Particular embodiments relate to packages for micro-electrical-mechanical systems ("MEMS") that are suitable for use in magnetic-resonance imaging ("MRI") equipment and in other applications that require non-magnetic components.

Discussion of Art

Micro-electro-mechanical systems ("MEMS") are devices that have their largest dimension within a range from about 20 micrometers to about 1 millimeter (0.02-1.0 mm). These very small electrical machines are useful in many applications, for example: ejecting ink from the cartridges of inkjet printers to put letters onto a page; measuring accelerations of a vehicle or of a handheld device such as a cellular phone or a game controller; transducing air pressure waves or surface vibrations to record sound; switching optical signals among fiber arrays; etc.

Generally, MEMS are useful for reliably providing highly responsive (small time constant) electromechanical functionality, such as motion sensing, within a small footprint or volume envelope. Accordingly, it has been desired for several years to make use of MEMS for sensing and control within MRI systems. However, it is necessary in MRI systems to provide components that are "non-magnetic," i.e., neither ferromagnetic nor paramagnetic.

To date, MEMS packaging has relied upon materials that are either ferromagnetic and/or paramagnetic. This has been the case in part because packages fabricated from non-magnetic materials, e.g., ceramics or plastics, have been understood to require closure methods that risked thermal damage, e.g., brazing, and/or chemical damage, e.g., volatile or moisture-permeable adhesives, to the MEMS enclosed within the packages. MEMs are sensitive to their environment, particulate or chemically, and also are sensitive to the packaging processing conditions, thus the need for a process to control the conditions and package environment. Indeed, MEMS typify a category of "sensitive" components that require special care in packaging. Other constituents of this category may include piezoelectric, paramagnetic, and shape memory alloy devices.

In view of the above, it is desirable to provide a sensitive component within a non-magnetic hermetic package. A key difficulty in providing such a package has been to devise a method of bonding a sensitive component into an open non-magnetic package cavity, then sealing the package cavity, without inducing thermal and/or chemical damage to the sensitive component.

BRIEF DESCRIPTION

Embodiments of the invention provide a non-magnetic hermetic MEMS package, which includes a non-magnetic ceramic package body having walls that surround a cavity, with a generally planar non-magnetic and metallic seal ring disposed around upper edges of the walls; an undamaged MEMS device that is bonded to the package body within the cavity; and a non-magnetic lid that is sealed to the seal ring of the package body to close the cavity by an hermetic metallic seal.

Other embodiments of the invention provide a non-magnetic ceramic package body, which includes walls that surround a cavity; a generally planar non-magnetic and metallic seal ring disposed in a continuous loop around upper edges of the walls; and a MEMS device bonded to the package body within the cavity.

Other aspects of the invention provide for making a non-magnetic hermetic MEMS package according to a method that includes forming a non-magnetic ceramic package body having walls that surround an open cavity; installing a non-magnetic and generally planar metallic seal ring in a continuous loop around upper edges of the package body walls; bonding a MEMS device to the package body within the cavity; and sealing a non-magnetic lid to the seal ring.

Yet other aspects of the invention provide a method for fluxless solder bonding a MEMS device to a package body, which includes providing an indium preform between facing surfaces of the MEMS device and of the package body; without introducing flux, heating and holding the indium preform within a reflow temperature range; and scrubbing the MEMS device against the indium preform to reflow and adhere the indium preform to the MEMS device and to the package body.

DRAWINGS

The present invention will be better understood from reading the following description of non-limiting embodiments, with reference to the attached drawings, wherein below.

DETAILED DESCRIPTION

Reference will be made below in detail to exemplary embodiments of the invention, examples of which are illustrated in the accompanying drawings. Wherever possible, the same reference characters used throughout the drawings refer to the same or like parts, without duplicative description. Although exemplary embodiments of the present invention are described with respect to their use in MRI systems, embodiments of the invention are applicable for use in any setting that can benefit from non-magnetic switches or sensors.

As used herein, the terms "substantially," "generally," and "about" indicate conditions within reasonably achievable manufacturing and assembly tolerances, relative to ideal desired conditions suitable for achieving the functional purpose of a component or assembly.

Figure 1:
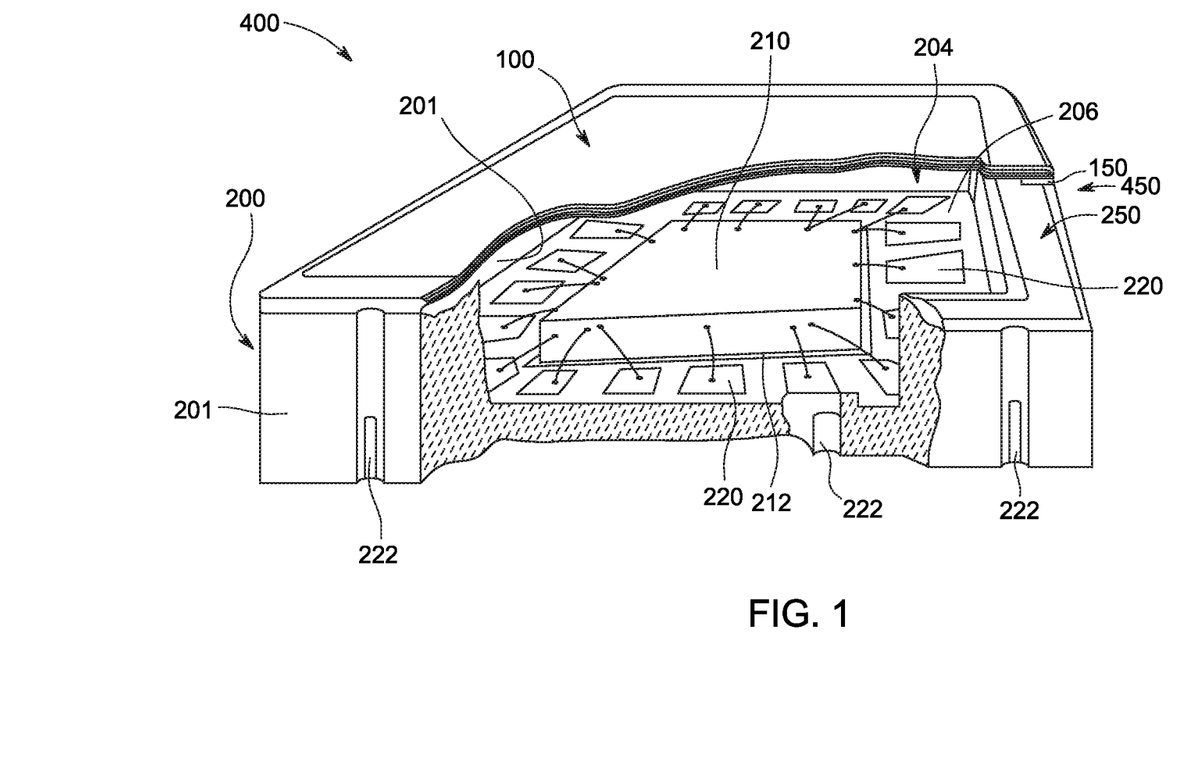
FIG. 1 is a perspective partially sectioned view of a non-magnetic package including an exemplary non-magnetic lid that is sealed to a non-magnetic package body, according to embodiments of the invention.

In an exemplary embodiment, as shown in FIG. 1, a non-magnetic MEMS package body 200 includes a wall 201 that is topped by the generally planar metallic seal ring 250. The wall 201 encloses a cavity 204. Within the cavity 204, a MEMS (micro-electro-mechanical) device 210 is mounted within the package body 200 to a floor 206, which can have multiple levels or steps, by a low temperature, fluxless indium soldering process. An exemplary "low temperature" soldering process includes placing an indium preform 212 into the package body 200, placing the package body onto a bonding stage, placing the MEMS device 210 onto the indium preform, heating the MEMS device and package body to a reflow temperature of about 150° C. but no more than about 200° C., holding at the reflow temperature for at least about 15 seconds, and cooling down from the reflow temperature (optionally, with use of a cooling blow). Typically, either or both of the undersurface ("backside") of the MEMS device 210, as well as the mating region of the package body floor 206, will have been pre-coated with a non-magnetic solderable coating (not shown) such as TiW/Au, W/Cu/Au, or W/Cu/Pd/Au.

MEM structures can be fabricated from temperature sensitive materials or alloys such as AuNi, NiW, or the like, which tend to degrade or deform above about 200° C. Thus, soldering at low temperature, e.g., with a bonding stage head temperature not exceeding about 210° C., averts damage to the MEMS device 210. Moreover, soldering without use of flux eliminates a potential source of volatile chemicals from the flux off-gassing, thus, enables a chemically inert dry air environment to be maintained within the MEMS package 400 after seam sealing. However, without use of flux, which typically lowers breaks down oxides and surface contamination to improve wetting/surface tension and surface adhesion of solder, it can be difficult to obtain a good solder bond with the oxide impurities still in place.

Accordingly, during the hold at reflow temperature, a pick and place tool is used to scrub or oscillate the MEMS device 210 across the indium preform, thereby breaking up the oxides and enhancing reflow of the preform in order to achieve a good mechanical bond between the MEMS device and the package body 200, without use of flux or inert atmosphere, i.e., forming gas. The scrubbing motion of the MEMS device 210 may be purely lateral reciprocation, or can be a swirling or side-stepped motion or a random motion within an areal envelope or strictly in Z motion, i.e., as a tapping motion or even as a single up-and-down motion that may break surface tension and initial adhesion of a solder oxide layer to the die. The scrubbing motion of the MEMS device 210 may be accomplished during a dwell stage of the reflow temperature profile. In an embodiment with the MEMS device being about 3 mm square, contact load of the pick and place tool against the MEMS device 210 may be at least about 0.2 newtons in order to achieve reflow, but may be not more than about 6 newtons in order to avoid exceeding design loads on the MEMS device or substrate. In certain embodiments, contact load may be about 5 newtons. Appropriate contact load will vary according to the size and durability of the MEMS device 210. The pick tool is in contact with the MEMS device 210 throughout the scrubbing motion, and the pick tool head is heated to aid in heat transfer to the solder through the MEMS device. For example, the pick tool head may be heated to at least about 150° C., or as much as about 180° C. for thorough heating of the solder adjacent the MEMS device, but may be heated to no more than about 210° C. in order to avert damage to the MEMS device 210.

In an embodiment, the seal ring 250 is formed in three layers: a transition layer 252 of tungsten, a seed layer 254 of copper, and a seal layer 256 of gold. Each of the seal ring layer materials is selected for optimal bonding to adjacent layers, e.g., the tungsten transition layer 252 is optimally suited for bonding to the ceramic wall 201, while the copper seed layer 254 is optimally compatible both with the tungsten and with the gold seal layer. Due to temperature limitations of the MEMS device 210, the seal ring 250 is formed at the upper edge of the ceramic wall 201, before the MEMS device is mounted into the cavity 204. Optionally, a layer 255 of palladium can be provided between the copper and the gold.

Once the MEMS device 210 has been mechanically solder bonded onto the package body 200, at the floor 206 of the cavity 204, then the MEMS device 210 can be electrically wirebonded to contacts 220, which extend from inside the cavity 204 through the package body 200 to external pins 222. In certain embodiments, as-installed capacitance between each pair of external pins 222, through the installed MEMS device 210, is less than about 2 pF. As an alternative to the solder bonding and wirebonding, steps as described above, external gold points of the MEMS device 210 may instead be ultrasonically welded to the gold electrical contacts 220 that are formed on the package body.

Following wire bonding, the MEMS package body 200, the MEMS device 210, and the lid 100 (prior to attachment of a solder preform) may be vacuum baked for removal of moisture and other volatiles. For example, a 100° C./30-minute dwell may be implemented in a vacuum oven. Immediately after vacuum baking, the package body 200 and the MEMS device 210 may be ashed using a commercially available oxygen ashing process.

Within about no more than one hour after oxygen ashing of the package body 200, and typically within no more than about 30 minutes after ashing, the lid 100 is joined to the package body by seam sealing (with an optional preliminary step of tacking). The seam sealing and tacking are accomplished within a glove box environment filled with clean "dry air," i.e., standard air with particulates filtered out and with water vapor removed to dew point of less than −40° C. or less than 10,000 ppm. For example, clean dry air may be filtered to meet at least ISO Class 8; in some embodiments, at least ISO Class 6; in certain embodiments, at least ISO Class 4. It should be noted that seam sealing under air, which includes a substantial fraction of oxygen (about 21%), can helpful toward achieving certain performance targets for as-built devices.

For example, in certain embodiments, on-resistance of the MEMS device 210 drifts no more than 1 ohm after an initial burn-in. Low drift can be achieved because the hermetic seal of clean dry standard air, within the package 400, results in an equilibriated oxidation of the MEMS switch device contacts and other surfaces. Whereas equilibriated oxidation cannot occur in an unsealed package, it also cannot occur within oxygen-free (e.g., inert gas or vacuum) sealed packages. The equilibriated oxide layer acts to stabilize mechanical and electrical performance of MEMS switch contacts, thereby maintaining on-resistance drift to less than 1 ohm.

Figure 2:
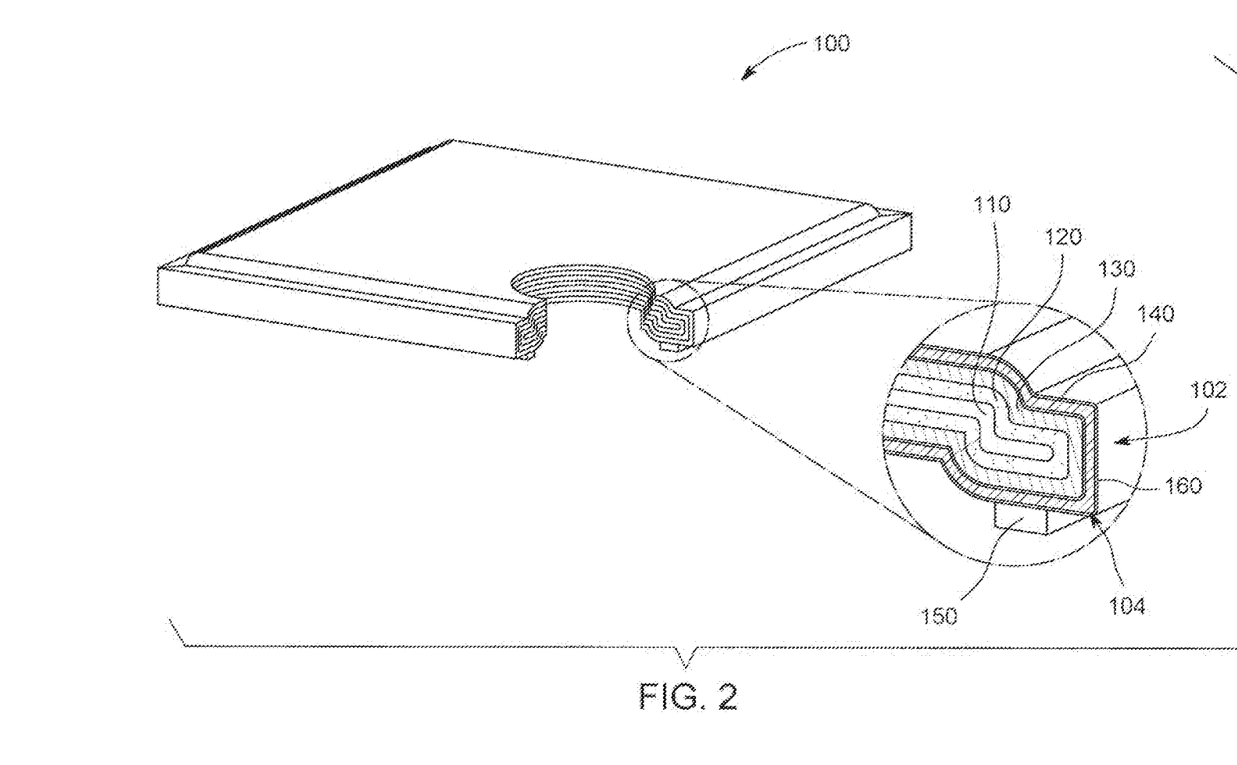
FIG. 2 is a perspective partially sectioned view of the non-magnetic lid of FIG. 1.
Figure 4:
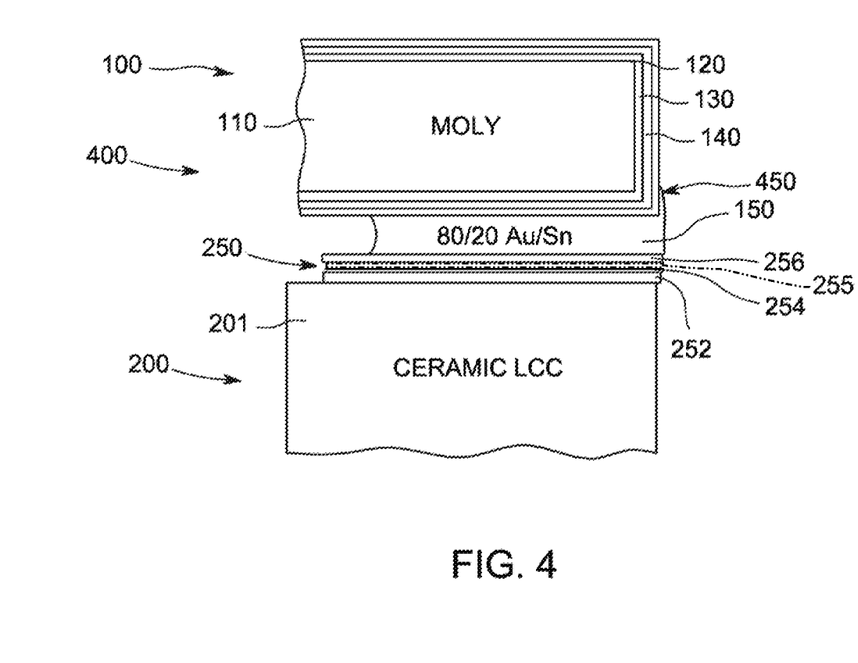
FIG. 4 is a partial sectioned detail view of a seam-seal between the non-magnetic lid and the non-magnetic package body of FIG. 1.

Still referring to FIG. 1, a non-magnetic lid 100 (of which an exemplary embodiment is shown, in greater detail, in FIG. 2) can be seam-sealed onto the non-magnetic MEMS package body 200 to provide a hermetic non-magnetic MEMS package 400. The non-magnetic lid 100 includes, at a minimum, a molybdenum substrate 110 and a gold/tin solder preform 150 that extends around an outer periphery 102 of a sealing surface 104 of the lid. FIG. 4 shows a partial sectioned schematic of the hermetic seam-seal 450 that is formed between the preform 150 of the lid 100 and the seal ring 250 of the package body 200, as discussed above. As used herein, "hermetic" means obtaining a helium leak rate of $3\times10^{-8}$ mBarr L/s or less using a helium fine leak tester (e.g., an Alcatel™ ASM180 model) after two hours hold under at least 60 psi helium; and showing no bubbles in 125C solution of FC-40; or equivalent test results.

Figure 3A:
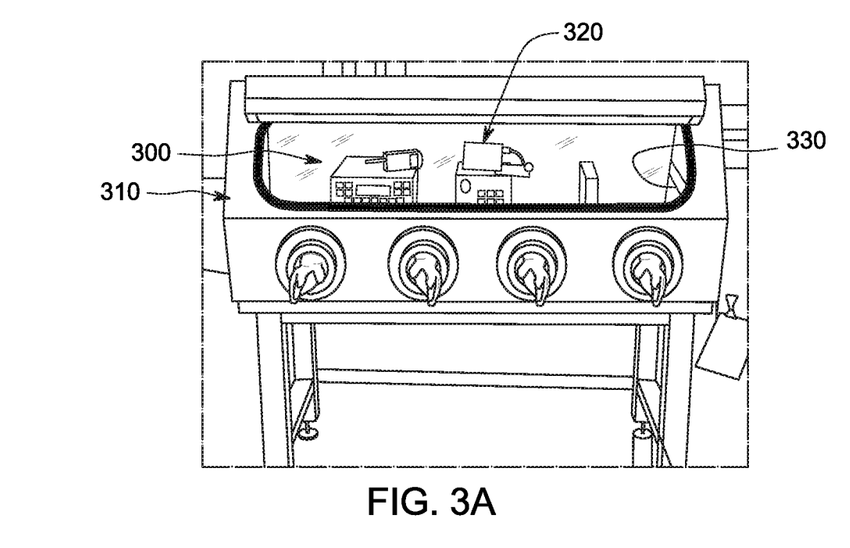
FIGS. 3A-3C are perspective views of a glove box, tacker, oven, and seam sealer used to fabricate an embodiment of the invention.
Figure 3B:
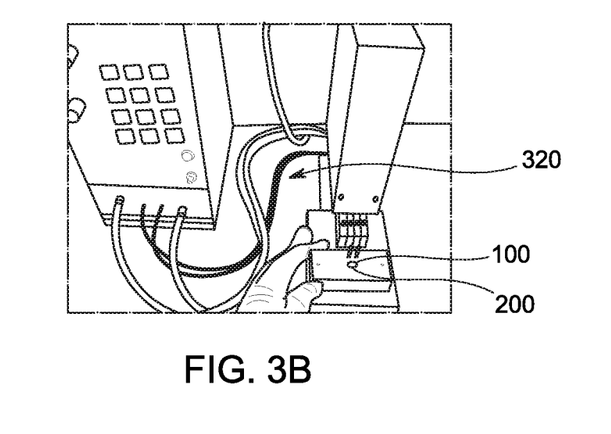
Figure 3C:
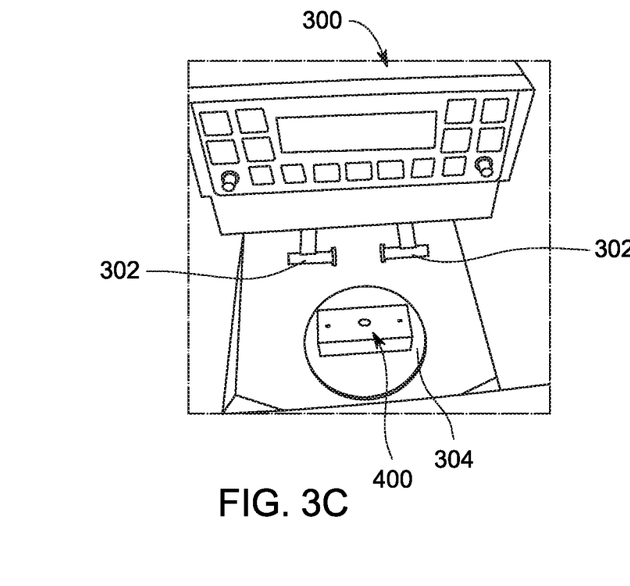

Referring now to FIGS. 3A-3C, the non-magnetic lid 100 is sealed onto the non-magnetic MEMS package body 200 by using a seam sealer 300 and a tack welder 320, which are housed within a dry air glove box 310. The seam sealer 300 applies electrical current from its electrodes 302 progressively to the lid 100 and to the patterned metallic seal ring 250 of the package body 200, thereby locally reflowing the Au/Sn preform and sealing together the lid 100 with the metallic seal ring 250. Notably, adhesion of the palladium layer 140, and/or the gold coating 160, around the edge 102 of the lid 100 enables a fillet 450 to extend up over the edge of the lid, thereby enhancing sealing of the seam.

Referring particularly to FIG. 2, an exemplary embodiment of the lid 100 includes a molybdenum substrate 110. For example, the substrate 110 may be stamped or cut to a flat shape, or it may be stamped or drawn to a concave or stepped shape. The substrate is at least about 5 mil (0.005 inch) thick, usually about 10 mil thick, but can be thicker. Generally, a minimum thickness for the substrate 110 is set by a desire to maintain dry air (e.g., less than about 10,000 ppm water vapor, or less than −40° C. dew point) at an atmospheric pressure within the package 400, even during depressurized air cargo transport, without permanent deformation of the substrate; a maximum thickness is limited by practicability of manufacture, and by a generic desire to reduce total assembly weight. The molybdenum substrate also desirably provides for thermal and electrical bulk resistivities that will facilitate seam-sealing by localized electrical heating, as described above.

The exemplary embodiment of the lid 100 also includes, over the molybdenum substrate 110, an adhesion layer 120 that is at least about 500 angstrom thick and can be up to about 2000 angstrom thick. The adhesion layer can be sputtered onto the substrate 110 from titanium or from similar molybdenum-compatible metals such as tantalum or chromium. In certain embodiments, equivalent methods of physical vapor deposition (PVD) can be used in place of sputtering. PVD processes include cathodic arc, electron beam, resistive evaporative, pulsed laser, and magnetic sputtering deposition techniques. In certain embodiments, magnetic sputtering is the coating method, primarily due to chemical difficulties in electroplating or chemical vapor deposition (CVD). A sputtered adhesion layer has been found more uniform and provide better adhesion than a plated or CVD adhesion layer, and sputter systems provide back sputter capabilities to improve adhesion further. Other PVD techniques are believed equally suitable by comparison to electrochemical or CVD techniques. The adhesion layer 120 is sputtered onto opposite broad surfaces of the substrate, and is sputtered at least thick enough that the edges of the sputtered regions join to cover the edges of the substrate; thus, minimum acceptably thickness of the adhesion layer will vary according to thickness of the substrate. The adhesion layer 120 generally is not much thicker than needed to cover the edges of the substrate from the two broad surfaces.

Over the adhesion layer 120, the lid has a copper seed layer 130 that is sputtered to at least about 1000 angstrom thick. Copper has been found suitable for the seed layer 130 in terms of its compatibility with the titanium/tantalum/chromium adhesion layer, and in terms of its acceptance for palladium electroplating. The seed layer 130 is not directly sputtered onto the molybdenum because the adhesion layer 120 has been found to greatly enhance attachment of the seed layer 130 to the substrate 110. In some embodiments the seed layer 130 may be about 2000 angstrom thick, and in certain embodiments the seed layer may be as much as about 6000 angstrom thick. A thicker seed layer helps to buffer back-etch from a subsequent step of electroplating, and helps to cover edges of the substrate. On the other hand, increased thickness adds cost and weight, and an excessive thickness of copper, which is highly thermally conductive, may present problems with a later step of seam-sealing the lid to close the MEMS package.

Outside the seed layer 130, the lid 100 includes a palladium solder base layer 140 that is about 1-2 µm thick, where again the thickness is chosen to ensure that edges of the substrate 110 are covered. The palladium solder base layer 140 typically is electroplated onto the copper seed layer 130. Accordingly, the palladium solder base layer 140 will cover all surfaces of the lid 100 so as to mitigate tarnishing of the copper seed layer. In other embodiments, the solder base layer 140 may be sputtered onto just one surface (a sealing surface 104) of the lid 100.

On the sealing surface 104 of the lid 100, near its edges, the gold/tin solder preform 150 then are attached to the solder base layer 140, e.g., by tack welding. Overall, the materials and various layer thicknesses of the lid 100 are chosen so that the lid has bulk resistivity sufficiently high to focus current for spot seam sealing of the solder preform 150, as opposed to welding the lid itself. Thus, the inventive lid 100 allows for a low power seam sealing process that does not impose bulk heating of the lid or of a structure to which the lid is attached. Therefore, it is possible to use the lid for hermetic sealing of a MEMS package, without risking thermal damage to a MEMS device within the package. The lid 100 also may include a gold flash layer 160 between the palladium solder base layer 140 and the solder preform 150.

Referring again to FIG. 3, the steps of tacking and seam sealing are accomplished within a glove box 310, which maintains clean air under dry conditions (less than about −40° C. dew point, 0% relative humidity, less than about 10,000 ppm water vapor). During tacking, the lid 100 is placed onto the package body 200 and the two components are placed together into a tack-welder 320 within the glove box. The tack welder 320 is used to lightly press down the lid 100 and to tack the lid with the gold/tin solder preform 150 onto the metallic seal ring 250 at one or two locations. Before tacking, the lid 100 and the package body 200 may be O2 ashed/cleaned and then purged with CDA (clean dry air as discussed below) and heated in a vacuum oven 330, which is connected with and opens into the glove box 310. For seam sealing, the package body 200 is transferred within the glove box onto a rotatable stage 304 of the seam sealer 300.

The seam sealer 300 then is operated to rotate the stage 304 with the lid and body, while retracting and extending the electrodes 302, so as to move the electrode contact along the edge 102 of the lid 100 that the preform 150 and the seal ring 250 will be progressively locally heated and welded to form a hermetic weld or solder fillet between the solder base layer and an opposed seal ring. In this regard it is helpful to have the edges of the substrate 110 fully covered by the solder base layer 140 and subordinate layers 120, 130, so as to form a uniform fillet 450 that goes up the side edge of the lid 100, as shown in FIG. 4. Additionally, it is helpful to have the lid and package body tacked together at only one location, where the electrodes 302 will start the seam-sealing process.

According to an aspect of the invention seam sealing, which is a localized resistance welding/heating process, is usable as opposed to brazing (which is well known for sealing solder preforms). Although brazing and furnace solder reflow have been conventional for sealing packages such as the inventive package 400, it turns out that the generalized high temperatures obtained during brazing can damage and deform the MEMS device that is meant to be enclosed within the hermetic MEMS package. Also, in furnaces, it is difficult to establish a CDA environment. Furnaces typically have forming gas or inert atmosphere for convective heating, the glove box and seam sealing eliminate need for convective heating and thereby enable use of clean dry air. However, in order to implement seam sealing, it is necessary that the lid 100 must enable localized heating resistively. Many non-magnetic metals make it very difficult to provide heat only in a local area, because such metals tend to be highly thermally and/or electrically conductive. Therefore, the materials and layer thicknesses of the lid 100 are carefully selected in order to optimize seam sealing, in a manner not previously considered.

Processes as described above result in a hermetic and non-magnetic MEMS package 400, which is usable in various applications including within MRI enclosures. Because dry air at atmospheric pressure is captured inside the package 400, it also may be usable in other environments where MEMs have not previously been considered.

Embodiments of the invention provide a non-magnetic hermetic package, which includes walls that define an interior cavity, with a generally planar non-magnetic and metallic seal ring disposed around upper edges of the walls; at least one electrical contact in the interior cavity extending from the interior through the walls to an external pin; an undamaged sensitive component that is bonded to the package body within the cavity; and a non-magnetic lid that is sealed to the seal ring of the package body to close the cavity by an hermetic metallic seal. The seal ring may include a tungsten layer that is bonded to the package body walls, a copper layer over the tungsten layer, and a gold layer over the copper layer, with the gold layer bonded to the metallic seal. Alternatively, the seal ring could include W/Cu/Pd/Au layers. The metallic seal may be formed by gold/tin solder. For example, the metallic seal may be formed by seam-sealing the gold/tin solder to a gold layer of the metallic seal ring. Thus, the non-magnetic lid may include, at a sealing surface of the lid, a gold/tin solder preform. The package also may include electrical contacts inside the cavity that are electrically connected with the sensitive component, and further may include external pins formed on the package walls and electrically connected with each other via the sensitive component and the electrical contacts inside the cavity, the capacitances among the external pins via the sensitive component being less than about 2 pF. The sensitive component may be a MEMS device, in particular a switch that has stable on-resistance that drifts less than 1 ohm after burn-in, and/or a blocking voltage of at least about 250 V. The non-magnetic lid may be seam sealed to the seal ring in clean dry air with approximately atmospheric oxygen concentration.

Other embodiments of the invention provide a non-magnetic ceramic package, which includes walls that surround a cavity; a generally planar non-magnetic and metallic seal ring around upper edges of the walls; and at least one electrical contact in the interior cavity extending from the interior through the walls to an external pin. The seal ring includes a tungsten layer that was bonded to the package body walls, a copper layer over the tungsten layer, and a gold layer over the copper layer. The seal ring also may include a palladium layer between the gold and copper layers. The sensitive component may have been bonded to the package body using a fluxless low temperature solder process. Indium may have been used in the solder process.

Other aspects of the invention provide for making a non-magnetic hermetic package according to a method that includes forming a non-magnetic ceramic package body having walls that surround an open cavity and having a non-magnetic and generally planar metallic seal ring in a continuous loop around upper edges of the package body walls; bonding a sensitive component to the package body within the cavity; and sealing a non-magnetic lid to the seal ring. Installing the seal ring may include forming the non-magnetic and generally planar metallic seal ring by first forming a tungsten layer to be bonded to the package body walls, then depositing a copper layer onto the tungsten layer, and then depositing a gold layer over the copper layer. In some aspects, installing the seal ring may include depositing a tungsten layer in a continuous loop around the upper edges of the package body walls, then depositing a copper layer onto the tungsten layer, and then depositing a gold layer over the copper layer. Bonding the sensitive component may include a fluxless low temperature solder process, in which indium may be used as the low temperature solder. The low temperature solder process may include a scrubbing motion of the sensitive component with reference to the package body. Certain aspects of the method may include pre-coating facing surfaces of the sensitive component and of the package body cavity with a non-magnetic solderable coating, which consists essentially of TiW/Au or of W/Cu/Au. Sealing the non-magnetic lid may be carried out as a seam-sealing process. Optionally, the package body and sensitive component may be ashed and/or vacuum baked before sealing the non-magnetic lid to the non-magnetic metallic seal ring. Optionally, seam-sealing the non-magnetic lid may be accomplished under dry air at about 1 atm. Additionally, the package body, sensitive component, and lid may be heated in an oven under dry air at about 1 atm before sealing the non-magnetic lid to the non-magnetic metallic seal ring.

Other aspects of the invention provide a method for fluxless solder bonding a MEMS device to a package body, which includes providing an indium preform between facing surfaces of the MEMS device and of the package body; without introducing flux or forming gas, heating and holding the indium preform within a reflow temperature range; and scrubbing the MEMS device against the indium preform to reflow and adhere the indium preform to the MEMS device and to the package body. The method also may include pre-coating at least one of the facing surfaces with a non-magnetic solderable coating. For example, the non-magnetic solderable coating may include either TiW/Au or W/Cu/Au. The reflow temperature range may be between about 150° C. and about 210° C. For example, the indium preform may be held at about 200° C. but not more than about 210° C. The indium preform may be heated via the package body and via the MEMS device.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. While the dimensions and types of materials described herein are intended to define the parameters of the invention, they are by no means limiting and are exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, terms such as "first," "second," "third," "upper," "lower," "bottom," "top," etc. are used merely as labels, and are not intended to impose numerical or positional requirements on their objects. Further, the limitations of the following claims are not written in means-plus-function format and are not intended to be interpreted based on 35 U.S.C. § 112, sixth paragraph, unless and until such claim limitations expressly use the phrase "means for" followed by a statement of function void of further structure.

This written description uses examples to disclose several embodiments of the invention, including the best mode, and also to enable one of ordinary skill in the art to practice embodiments of the invention, including making and using any devices or systems and performing any incorporated methods. The patentable scope of the invention is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal language of the claims.

As used herein, an element or step recited in the singular and proceeded with the word "a" or "an" should be understood as not excluding plural of the elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the above-described article and method of making, without departing from the spirit and scope of the invention herein involved, it is intended that all of the subject matter of the above description or shown in the accompanying drawings shall be interpreted merely as examples illustrating the inventive concept herein and shall not be construed as limiting the invention.

What is claimed is:

1. A non-magnetic hermetic package comprising:
   a package body comprising a floor and a wall extending upward from the floor;
   a seal ring extending around an upper edge of the wall, the seal ring consisting of non-magnetic metallic elements;
   a lid;
   a hermetic seam seal between the lid and the seal ring; and
   a sensitive component disposed within a hermetically-sealed cavity defined between the package body and the lid;
   wherein the seal ring comprises:
      a tungsten layer bonded to the upper edge of the wall;
      a copper layer bonded to the tungsten layer absent another metallic layer therebetween; and
      a gold layer bonded to the copper layer and to the lid.

2. The package of claim 1 wherein the hermetic seam seal comprises a fillet that extends up over an outer edge of the lid.

3. The package of claim 1 further comprising an indium solder preform bonding the sensitive component to the floor of the package body within the cavity.

4. The package of claim 1 wherein the cavity is filled with clean dry air.

5. The package of claim 4 wherein the clean dry air comprises at least one of 1) oxygen at approximately atmospheric concentration and 2) a dew point of less than −40° C. or a particulate concentration of less than 10,000 ppm.

6. The package of claim 1 wherein the lid consists of non-magnetic metallic elements.

7. The package of claim 1 wherein the sensitive component comprises a micro-electro-mechanical (MEMS) device.

8. A micro-electro-mechanical (MEMS) package comprising:
   a package body comprising a floor and a wall extending upward from the floor;
   a seal ring on an upper surface of the wall of the package body;
   a lid;
   a hermetic seam seal that couples the lid to the seal ring; and
   a MEMS device mounted within a hermetically sealed cavity defined between the package body and the lid;
   wherein the package body, the seal ring, and the lid consist of non-magnetic elements; and
   wherein the lid comprises molybdenum, copper, and palladium.

9. The MEMS package of claim 8 further comprising a low temperature solder coupling the MEMS device to the package body.

10. The MEMS package of claim 8 wherein the hermetic seam seal comprises a solder fillet that extends up a side edge of the lid.

11. The MEMS package of claim 8 wherein the hermetically sealed cavity is filled with clean dry air at atmospheric pressure.

12. The MEMS package of claim 8 wherein the MEMS device is mounted to the floor of the package body via an indium preform.

13. The MEMS package of claim 8 further comprising a plurality of external pins formed on the wall, the plurality of external pins electrically coupled to the MEMS device via electrical contacts that extend through the floor of the package body.

14. A method of manufacturing a non-magnetic hermetic package comprising:
   providing a package body comprising a floor and a wall extending upward from the floor;
   forming a seal ring on a top surface of the wall of the package body, the seal ring consisting of non-magnetic metallic elements;
   mounting a device to the floor of the package body; and
   seam-sealing a non-magnetic metallic lid to the package body with a seam sealer
   wherein forming the seal ring comprises:
      bonding a tungsten layer to the top surface of the wall of the package body;
      bonding a copper layer directly to the tungsten layer; and
      bonding a gold layer to the copper layer.

15. The method of claim 14 further comprising forming a solder fillet that extends up a side edge of the lid while seam-sealing the lid to the package body.

16. The package method of claim 14 further comprising using a low temperature, fluxless indium soldering process to mount the device to the floor of the package body.

17. The package method of claim 14 further comprising enclosing clean dry air within a cavity formed between the package body and the non-magnetic metallic lid while seam-sealing the non-magnetic metallic lid to the package body.

\* \* \* \* \*